United States Patent
Woell et al.

(10) Patent No.: US 9,757,767 B2
(45) Date of Patent: Sep. 12, 2017

(54) DEVICE AND METHOD FOR PRODUCING HIGHLY POROUS, CRYSTALLINE SURFACE COATINGS

(75) Inventors: Christof Woell, Bochum (DE); Osama Shekhah, Jeddah (SA); Matthias Franzreb, Karlsruhe (DE); Hasan Arslan, Bruchsal (DE); Jonas Wohlgemuth, Hassloch (DE); Roland Fischer, Bochum (DE)

(73) Assignee: KARLSRUHER INSTITUT FUER TECHNOLOGIE, Karlsruhe (DE)

( * ) Notice: Subject to any disclaimer, the term of this patent is extended or adjusted under 35 U.S.C. 154(b) by 669 days.

(21) Appl. No.: 14/116,014

(22) PCT Filed: May 25, 2012

(86) PCT No.: PCT/EP2012/059900
§ 371 (c)(1),
(2), (4) Date: Apr. 18, 2014

(87) PCT Pub. No.: WO2012/163854
PCT Pub. Date: Dec. 6, 2012

(65) Prior Publication Data
US 2014/0302304 A1 Oct. 9, 2014

(30) Foreign Application Priority Data
May 27, 2011 (DE) .................... 10 2011 050 684

(51) Int. Cl.
| | | |
|---|---|---|
| *B05D 1/02* | (2006.01) | |
| *B05D 1/38* | (2006.01) | |
| *B05D 3/04* | (2006.01) | |
| *H01L 21/67* | (2006.01) | |
| *B05D 3/10* | (2006.01) | |
| *B05D 7/00* | (2006.01) | |
| *B01D 67/00* | (2006.01) | |
| *B01D 71/00* | (2006.01) | |
| *B05B 7/24* | (2006.01) | |

(52) U.S. Cl.
CPC ........... *B05D 1/38* (2013.01); *B01D 67/0072* (2013.01); *B01D 71/00* (2013.01); *B05B 7/2489* (2013.01); *B05D 1/02* (2013.01); *B05D 3/107* (2013.01); *B05D 7/56* (2013.01); *H01L 21/6715* (2013.01); *B01D 2323/42* (2013.01); *B05D 3/0466* (2013.01); *B05D 3/0486* (2013.01); *B05D 2203/30* (2013.01); *B05D 2401/10* (2013.01); *Y10T 428/249953* (2015.04)

(58) Field of Classification Search
CPC . B05D 1/02; B05D 1/38; B05D 3/107; B05D 7/50; B05D 7/56; B05D 2203/30; B05D 2401/10

USPC .......... 427/331, 337, 352, 402, 419.1, 421.1
See application file for complete search history.

(56) References Cited

U.S. PATENT DOCUMENTS

| | | |
|---|---|---|
| 2009/0169857 A1 | 7/2009 | Fischer et al. |
| 2010/0003499 A1 | 1/2010 | Krogman et al. |
| 2011/0064936 A1* | 3/2011 | Richmond-Cunningham B01D 53/228 428/306.6 |

FOREIGN PATENT DOCUMENTS

| | | |
|---|---|---|
| DE | 102005035762 A1 | 2/2007 |
| EP | 1448808 B1 | 5/2007 |
| WO | 2008030474 A2 | 3/2008 |
| WO | WO 2008/030474 A2 * | 3/2008 |

OTHER PUBLICATIONS

Zacher et al., "Thin films of metal-organic frameworks," Chem. Soc. Rev., 2009, 38, 1418-1429.*
Arslan et al., "High-Throughput Fabrication of Uniform and Homogeneous MOF Coatings," Adv. Funct. Mater., 2011, 21, 4228-4231.*
Shekhah et al., "Step-by-Step Route for the Synthesis of Metal-Organic Frameworks," J. Am. Chem. Soc. 2007, 129, 15118-15119.*
Zacher Denise et al: "Thin Films of metal-organic frameworks", Chemical Society Reviews, Chemical Society London, GB, vol. 38, No. 5, May 1, 2009.
Hasan K. Arslan et al:"High-Thoughput Fabrication of Uniform and Homogenous MOF coatings" Advanced Functional Materials, vol. 21, No. 22, Nov. 22, 2011, pp. 4228-4231.
Mueller, U.; Schubert, M.; Teich, F.;Puetter, H.; Schierle-Arndt, K.; Pastre, J. J. Mater. Chem. 2006, 16, 626-636.
G. Ferey, Chem. Soc. Rev. 2008, 37, 191.
Gero Decher, et al., Science 1997 277, 1232-1237.
Schlenoff J.; Dubas S.; and Farhat T.; Langmuir 2000; 16; 9968-9969.
Izquierdo A.; Ono S.S., Voegel J.C.; Schaaf P. and Decher G.; Langmuir 2005; 21, 7558-7567.
K. Uemura, R. Matsuda and S. Kitagawa, J. Solid State Chem., 2005, 178, 2420-2429.
Kolasinska M. et al.; Langmuir 2009; 25, 1224-1232.
Lu C. and Fery A. Chem. Mater. 2006; 18, 6204-6210.
O.M. Yaghi, M O'Keeffe, N.W. Ockwig, H.K. Chae, M. Eddaoudi and J. Kim, Nature, 2003, 423, 705.

* cited by examiner

*Primary Examiner* — William Philip Fletcher, III
(74) *Attorney, Agent, or Firm* — Abel Law Group, LLP

(57) ABSTRACT

The present invention relates to a device, the use thereof and a method for producing highly porous, crystalline surface coatings comprising at least two spraying devices operating in sequential sequence for applying coating agents from the storage vessels (3, 4) to a material arranged on a sample holder (1) and at least one rinsing device (5, 13, 16) for removing unbound molecules from the coated surface.

18 Claims, 4 Drawing Sheets

DEVICE AND METHOD FOR PRODUCING HIGHLY POROUS, CRYSTALLINE SURFACE COATINGS

BACKGROUND OF THE INVENTION

1. Field of the Invention

The present invention relates to a device and the use thereof for producing highly porous crystalline surface coatings and to a method using the device concerned.

2. Discussion of Background Information

Metal-organic frameworks (MOFs) are hybrid inorganic-organic solids with high porosity. Among their outstanding properties are high gas storage capacities for hydrogen and hydrocarbons and application potentials in the areas of gas separation, sensor technology and catalysis (Mueller, U.; Schubert, M.; Teich, F.; Puetter, H.; Schierle-Arndt, K.; Pastre, J. J. Mater. Chem. 2006, 16, 626-636).

Metal-organic frameworks are complex 2D or 3D zeolite-like networks with perfect translation symmetry. On the basis of coordination chemistry of the Werner type, metal-organic frameworks consist of metal cations $N^{m+}$ (m=2;3) and oligo-functionalized organic ligands. The design and precise control of the formation of the respective networks has been described and investigated repeatedly in the literature (G. Ferey, Chem. Soc. Rev. 2008, 37, 191, O. M. Yaghi, M O'Keeffe, N. W. Ockwig, H. K. Chae, M. Eddaoudi and J. Kim, Nature, 2003, 423, 705, K. Uemura, R. Matsuda and S. Kitagawa, J. Solid State Chem., 2005, 178, 2420-2429).

While the production of powdered metal-organic frameworks for storage materials can be carried out on a semi-industrial scale, the corresponding methods are not yet sufficient for nanotechnology. Such methods are required in particular for the production of membranes, catalytic coatings, chemical sensors and other nanotechnological applications.

For numerous applications of the coating of substrates with MOFs, in principle three possibilities have so far been pursued:
  a) growth or direct deposition from solvothermal solutions
  b) bringing together on surfaces nanocrystals previously formed in solution and
  c) layer-by-layer (quasi epitaxial) growth on a surface. (Zacher, D.; Shekhah, O.; Wöll, C.; Fischer, R. A. Chem. Soc. Rev. 2009, 38, 1418-1429; Shekhah, O.; Materials, 2010, 3, 1302-1315)

The production of metal-organic frameworks is usually performed by solvothermal or hydrothermal methods, in which crystalline MOF particles are precipitated from a mixture of the precursor substances. However, such powdered materials are not suitable for a series of applications.

The production of multilayer surface coatings from different substances is partially carried out by cyclical dipping of the substrate into reservoirs filled with dissolved substances. An example is the method for producing polyelectrolyte layers (Gero Decher, et al., Science 1997 277, 1232-1237).

In the case of this method, the approximately monomolecular formation of the layers with simultaneous bonding of the different layers one on top of the other results from the use of oppositely charged polyelectrolytes. After the formation of a monomolecular layer, an electrostatic repulsion occurs, and then the adsorption of further molecules of the same charge is inhibited. If, however, the substrate is subsequently dipped into a second reservoir with a charge opposite to that of the polyelectrolytes, there is an electrostatic bonding attachment of a monolayer of this substance. A cyclical alternation of the dipping into the two reservoirs has the effect that a defined stratification of the polyelectrolyte layers forms. The arrangement of the polyelectrolyte molecules within a layer does not have a crystalline character.

Apart from the deposition of such polyelectrolyte layers from solutions, there is also the production of multilayer coatings using spraying processes. Examples are the production of surface coatings or films by cyclical, alternating spraying on of poly(styrene sulfonate) and polydiallyl-dimethyl-ammonium solutions (Schlenoff J.; Dubas S.; and Farhat T.; Langmuir 2000; 16; 9968-9969).

The spraying process is in this case performed by means of simple, manually pumped spray bottles. The resultant films display a uniform surface and, because of the use of the layer-by-layer technique, have a layer structure with layers oriented perpendicularly to the surface (Izquierdo A.; Ono S. S., Voegel J. C.; Schaaf P. and Decher G.; Langmuir 2005; 21, 7558-7567; Kolasinska M. et al.; Langmuir 2009; 25, 1224-1232; Lu C. and Fery A. Chem. Mater. 2006; 18, 6204-6210).

Also known is an automated spraying process for generating polyelectrolyte layers applied by the layer-by-layer technique. The spraying process is in this case performed by way of three externally controlled solenoid valves and spray nozzles, which spray the polyelectrolytes or water as a rinsing medium sequentially onto a surface. The solenoid valves in this case allow the spraying of the media that are under pressure in storage vessels to be electronically switched on and off. The pressure in the storage vessels is maintained by way of a nitrogen supply line and manually adjustable pressure regulators. For producing the layers, polyelectrolytes, combinations of polyelectrolytes with nanoparticles and a combination of polyacrylic acid and polyethylene oxide, which act by way of hydrogen bridge bonds, were in turn used. However, none of these systems has crystalline orders that can be demonstrated by X-ray diffractometry.

SUMMARY OF THE INVENTION

The object of the present invention was thus to produce highly porous crystalline surface coatings by means of a spraying method. It was intended to create the possibility of producing layers over a large surface area. Furthermore, it was intended to achieve a time saving in comparison with the previous method. In other words, it was intended to allow a rapid synthesis of multiple layers, with shorter synthesis times also leading to more constant conditions. At the same time, it was intended to achieve a material saving and a more favorable distribution coefficient between molecules in solution and molecules on the surface.

This object is achieved by the device for producing highly porous, crystalline surface coatings comprising at least two spraying devices, by way of which precursor substances for producing the surface coatings are applied to the surface from the storage vessel while supplying carrier gas from a storage container, and comprising at least one rinsing device for removing unbound molecules on the carrier material to be coated.

Furthermore, the object is achieved by a method for producing highly porous crystalline surface coatings in which
  a) precursor substances are applied to a surface of a carrier material by means of spraying devices while supplying carrier gas from a storage container, b) unbound molecules are rinsed off from the coated surface by means of rinsing devices,
c) further precursor substances are applied by means of the spraying devices,
d) unbound molecules are rinsed off from the coated surface by means of the rinsing devices,
e) steps a) to d) are repeated until the desired thicknesses of the surface layers are achieved.

The spraying devices are supplied with precursor substances, from which the coating materials form after spraying onto the coating surface, and which consequently serve for the coating of the surfaces. For example, the precursor substances are designed such that a crystal formation only takes place on the coated surface, i.e. only after the precursor substances are attached on the surface of the carrier material.

In a form that is preferred according to the invention, at least two, preferably 2 to 10, particularly preferably 2 to 6, spraying devices are provided, serving for supplying differently composed precursor substances. For example, precursor substances containing organic components may be supplied by way of one spraying device and precursor substances containing metal ions may be supplied by way of the second spraying device. The supplying of the individual precursor substances is regulated by way of corresponding measuring, control and regulation technology. Pressure-controlled regulating valves are preferably concerned.

The spraying devices are directed onto the surface of the carrier material to be coated. In a preferable embodiment of the invention, the spraying devices are aligned horizontally or virtually horizontally. The surface of the carrier material to be coated is preferably aligned vertically or virtually vertically. In a preferred arrangement of the invention, the material to be coated is mounted on a sample container. For example, it may be attached by means of negative pressure. In one variant of the invention, the sample container is designed to be controllable in its temperature.

The carrier gas is likewise metered and supplied to the spraying devices by way of a process controller. A nebulizing of the precursor substance solution is achieved by the supply of the carrier gas.

Within the scope of the present invention, before the beginning of the actual spraying process, the precursor substances are dissolved in a conventional solvent, preferably ethanol, DMF, water, and filled into the storage containers.

The device according to the invention allows a method which, by contrast with the prior art, operates in a strictly controlled spraying process with a sequential sequence of the application of various precursor substances. As a difference from the previously known spraying processes for producing polyelectrolyte multiple layers, special requirements arise with regard to the metering and distribution of the amounts of substance to be applied per surface area and also the rinsing processes between the applications of the precursor substances (producing a thin, very uniform liquid film of the precursor solution on the carrier material, a very efficient rinsing process for the complete removal of unbound remains of the preceding precursor solution, strict avoidance of contact with the precursor solutions in all of the system components, such as valves, tube supply devices, nozzles). This is ensured by the specific procedure according to the invention.

In particular, it is a decisive feature of the present invention that the coatings produced by the procedure according to the invention have a demonstrable crystallinity, i.e. a strictly three-dimensional order.

While the previously known spraying processes for producing layer-by-layer arrangements force a pressurized solution of the precursor substances through a nozzle, and thereby achieve the atomization, in the present invention the precursor substances are sucked in on the principle of an aspirator, the aforementioned carrier gases being used. In other words, by contrast with the prior art, a two-substance atomizer technique is used for the coating. This method allows the use of much smaller amounts of solution than is possible in the case of pressure-operated spray nozzles.

After each spraying of the surface, the surface is in turn rinsed, in order to remove unreacted molecules of the precursor substance solution. In the second step, precursor substance solution is then applied again and is rinsed again in the next step. In a form that is preferred according to the invention, firstly precursor substance containing one component, for example the organic component, is applied. In the second step, precursor substance containing the different component, for example the metal ions, is then sprayed on. Rinsing off is performed between each spraying operation. The corresponding spraying and rinsing processes are repeated as often as required until the desired layer thickness is achieved.

The surface coatings are formed by the spraying process. The rinsing is required to remove unbound precursor molecules completely before the next component is sprayed on. The rinsing process must in this case be complete and at the same time gentle, and so the spraying on of the rinsing solution is only to some extent suitable for this. The present invention therefore preferably uses a rinsing device that delivers the rinsing solution by way of a pump and applies it to the surface by way of a liquid distributor. The distributor is preferably designed such that the rinsing solution runs off from the upper end of the coated surfaces of the vertically or virtually vertically arranged carrier material downward on it.

The liquid generated by the spraying operation and the rinsing is collected at the bottom and removed by suction.

In a form that is preferred according to the invention, the spraying device, rinsing device and sample holder are located in a closed chamber. This is preferably a climatically controlled chamber, in which the temperature and atmospheric humidity are monitored. Both are regulated on the basis of the measurement results.

For the use of volatile precursor substance solvents, special safety precautions may also be provided. For instance, the climatically controlled chamber may be purged with nitrogen, in order to avoid the formation of explosive gas mixtures.

In the case of the metal ions, acetate compounds are preferably used for the precursor substances, since even when they are in solution they are in a conformation that corresponds to that in the later crystal lattice.

Carboxylates and pyridine compounds are preferably used as organic components.

Copper, iron and/or zinc ions, in particular Cu(II), Zn(II), Fe(III), are preferably used as metal ions.

The precursor substances are preferably in the form of solutions. The entire range of conventional solvents, preferably ethanol, DMF, water, comes into consideration as solvents.

Inert gases preferably come into consideration as the carrier gas. Nitrogen, argon and helium are particularly preferred.

According to the invention, ethanol, DMF and water are used in particular as rinsing agents.

The method according to the invention achieves a coating that has an ordered crystal structure. The layer produced is highly porous, with porosities of between 8 and 50 Angström. The invention for the first time allows the rapid and reliable production of homogeneously crystalline and highly porous coatings.

As application possibilities, reference is made to the simple and direct production of sensors by coating electrodes for quartz crystal microbalances. Furthermore, the inclusion of catalytically highly effective metallic nanoclusters in porous structures is possible. The MOS structure allows contact of the reactants with the catalyst while simultaneously preventing an agglomeration or detachment of the nanoclusters. The generation of novel membranes with a uniquely defined pore structure and orientation is likewise made possible by the methods according to the invention.

BRIEF DESCRIPTION OF THE DRAWINGS

The invention is explained in more detail below with reference to the figures.

Figure 1:
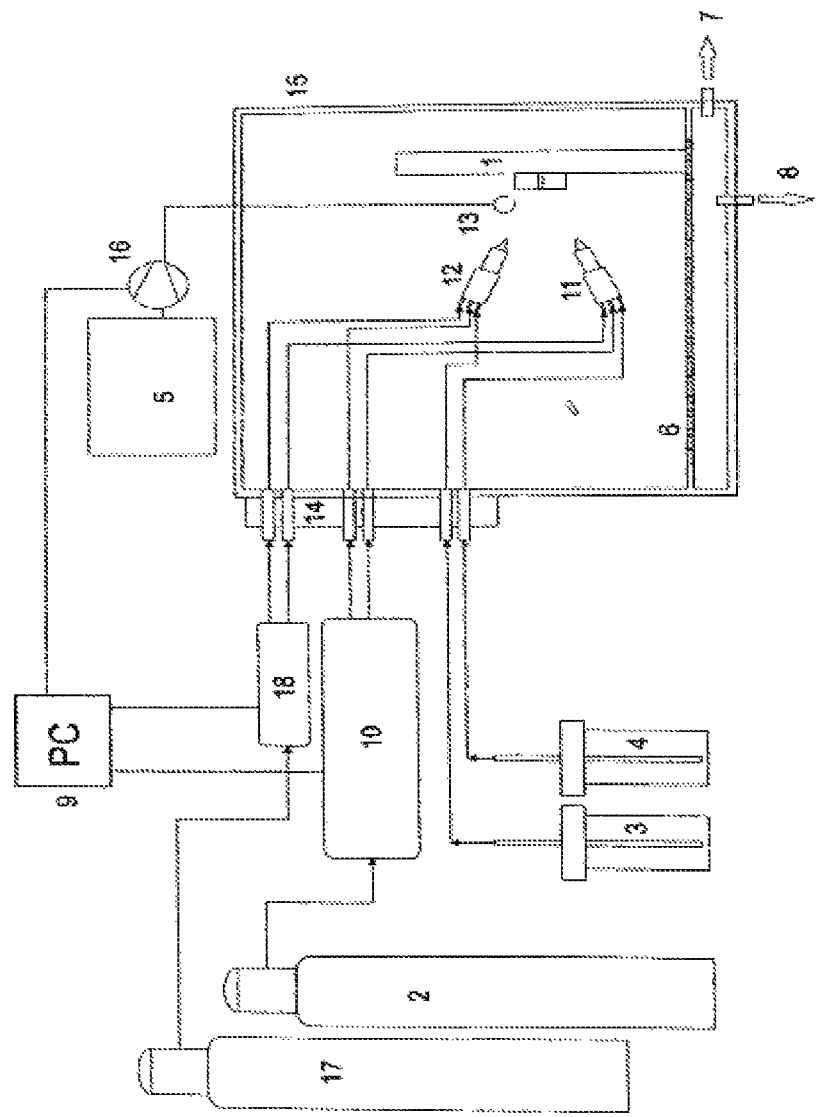
FIG. 1 shows an example of a system that can be used according to the invention.
Figure 2:
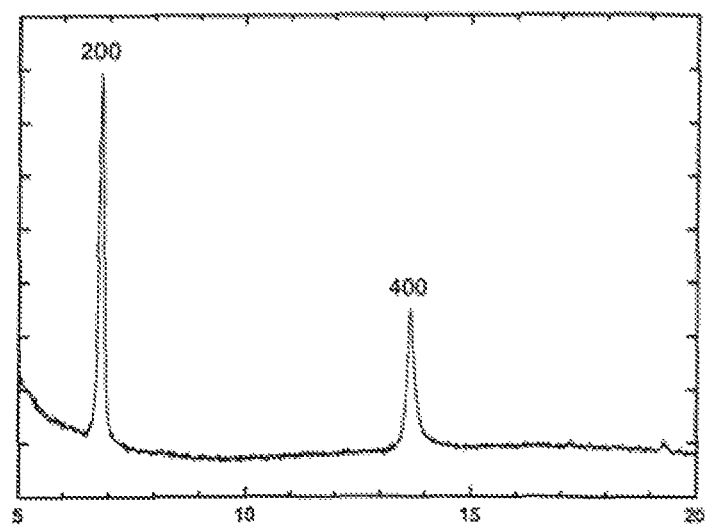
FIG. 2 shows the result of the X-ray diffractogram according to Example 1 (HKUST-1 (40 layers) on a COOH-functionalized surface).
Figure 3:
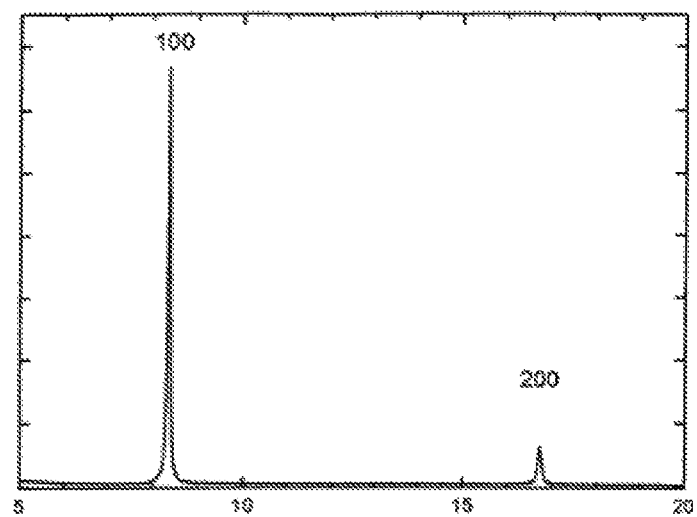
FIG. 3 shows the X-ray diffractogram according to Example 2 ($Cu_2(bdc)_2$ MOF (40 layers) on a COOH-functionalized surface).
Figure 4:
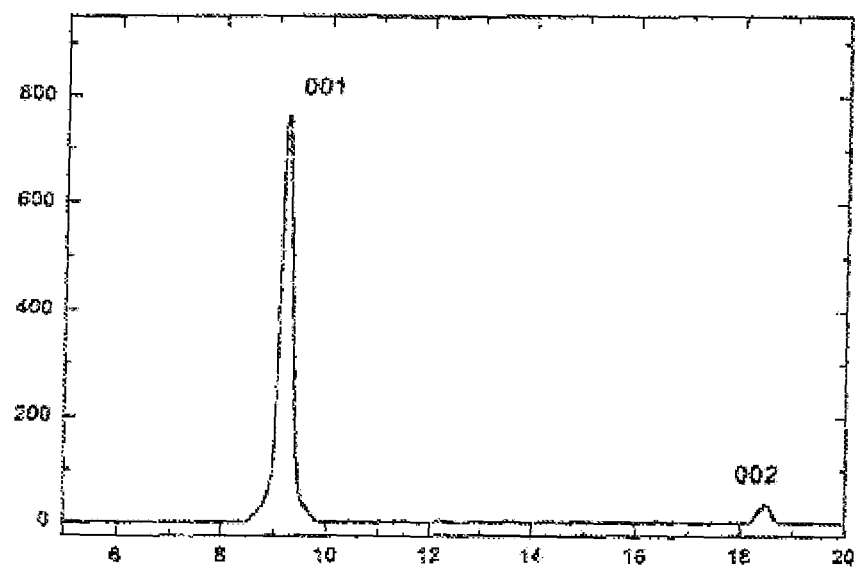
FIG. 4 shows the X-ray diffractogram according to Example 3 ($Cu_2(bdc)_2(dabco)$ MOF (20 layers) on a pyridine-functionalized surface).

The reference numerals in FIG. 1 have the following meaning:
1 Temperature-controllable and movable vacuum holding unit.
2 Gas bottle for inert gas.
3 Feed vessel for the precursor substance containing component A.
4 Feed vessel for the precursor substance containing component B.
5 Feed for rinsing solution.
6 Perforated baseplate.
7 Connection for the suction removal of gas.
8 Drain for liquids.
9 PC with control software.
10 Valve-testing or testing distributor with communication to the PC.
11 Spraying device for the precursor substance containing component A.
12 Spraying device for the precursor substance containing component B.
13 Outlet nozzle for rinsing solution.
14 Wall lead-through with quick connectors.
15 Temperature-controllable climatically controlled chamber.
16 Pump for rinsing solution.
17 Nitrogen supply for compressed-air valves.
18 Control block for compressed-air valves.

DETAILED DESCRIPTION OF THE PRESENT INVENTION

Using an inert gas 2, the spraying devices 11 and 12 can nebulize the precursor substances with the components A and B onto a surface without any droplets. The components A and B are chemical compounds that are different from one another. For example, A may be the organic component and B may be the component containing metal ions. These are applied separately by way of the spraying device 11 and 12, i.e. component A by way of the spraying device 11 and component B by way of the spraying device 12. With its feed 5 and the pump 16, the rinsing device 13 allows the supply of rinsing solution for the complete removal of unbound precursor molecules, without the sprayed-on layers being adversely influenced. For this, rinsing solution is applied to the coated surface from the feed 5 by means of the pump 16.

The spraying devices 11 and 12 are connected to the storage vessels 3 and 4. By supplying carrier gas from the storage container 2, solution of precursor substances is sucked in from the storage containers 3 and 4 on the principle of an aspirator. The opening of the precursor substance supply at the spraying devices 11 and 12 is performed by way of compressed-air-controlled regulating valves. On the other hand, the supply of carrier gas may take place by way of the computer-controlled process controller 9 and 10. Here, the device 10 is a valve or spray distributor, which is controlled by way of a PC 9.

The material of which the surface is to be coated is mounted vertically on the sample holder 1. The material is sucked against it by means of negative pressure.

The rinsing device 13 is arranged in such a way that rinsing agent emerging from it runs along on the surface of the coated material from the upper end and thus unreacted precursor substance molecules are rinsed off. Running-off rinsing solutions run away by way of the perforated baseplate 6. The liquids can be removed by suction by way of the opening 8.

In the system according to the invention as shown in FIG. 1, the sample holder 1, the rinsing device 13 and the coating devices 11 and 12 are arranged in a climatically controlled chamber 15, in which the temperature and atmospheric humidity can be monitored and regulated.

The device as shown in FIG. 1 also includes structural elements for the use of volatile precursor substance solvents, for example of ethanol. For this, the suction removal device 7 is provided. In other words, by means of this device, the climatically controlled chamber 15 can be purged by means of nitrogen, in order to avoid the formation of explosive gas mixtures.

All of the connections to the climatically controlled chamber can be accomplished by way of the quick couplings 14.

Example 1

Production of the MOF $Cu_3(btc)_2 \times H_2O$ HKUST-1 (40 layers) on a COOH-functionalized surface (btc=1,3,5-benzenetricarboxylic acid; HKUST=Hong Kong University of Science and Technology).

As preparation for the test, a self-assembled monolayer (SAM) was produced on a gold-coated piece (about 15×20 mm) of a silicon wafer by dipping into a mercaptohexadecanoic acid (MHDA) solution for 48 hours. After dipping, the sample was rinsed with ethanol and subsequently dried with nitrogen.

For the spraying process, firstly $Cu(CH_3COO)_2$ solution was sprayed onto the SAM for 15 seconds. As a second substance, BTC (benzenetricarboxylic acid) was sprayed on for 25 seconds. Between each spraying step, the sample was rinsed with ethanol. Altogether, 40 cycles of the sequence described were carried out. The resultant sample was dried and analyzed by means of XRD. The resultant X-ray diffractogram shows two sharp intensity peaks, which are evidence of the strictly crystalline and spatially ordered character of the layer formed. The corresponding layers consist of 40 layers.

Example 2

Production of the MOF $Cu_2(bdc)_2$ (40 layers) on a COOH-functionalized surface (bdc=benzenedicarboxylic acid).

As preparation for the test, a SAM was produced on a gold-coated piece (about 15×20 mm) of a silicon wafer by dipping into a mercaptohexadecanoic acid (MHDA) solution for 48 hours. After dipping, the sample was rinsed with ethanol and subsequently dried with nitrogen.

For the spraying process, firstly $Cu(CH_3COO)_2$ solution was sprayed onto the SAM for 15 seconds. As a second substance, bdc (bdc=1,4-benzenedicarboxylic acid) was sprayed on for 25 seconds. Between each spraying step, the sample was rinsed with ethanol. Altogether, 40 cycles of the sequence described were carried out. The resultant sample was dried and analyzed by means of XRD. Altogether, a 40-layer coating was obtained. The resultant very sharp intensity peaks also provide evidence for this second MOF type of the strictly crystalline and spatially ordered character of the layer formed.

Example 3

Production of the MOF $Cu_2(ndc)_2$ (dabco) (20 layers) on a pyridine-functionalized surface (20 cycles $[Cu_2(ndc)_2$ (dabco)] on pyridine SAM).

As preparation for the test, a SAM was produced on a gold-coated piece (about 15×20 mm) of a silicon wafer by dipping into a 4,4-pyridyl-benzenemethanethiol (PBMT) solution for 48 hours. After dipping, the sample was rinsed with ethanol and subsequently dried with nitrogen.

For the spraying process, firstly $Cu(CH_3COO)_2$ solution was sprayed onto the SAM for 15 seconds. As a second substance, a 1:1 mixture of ndc (ndc=naphthalenedicarboxylic acid) and dabco=1,4-diazabicyclo[2.2.2]octane was sprayed on for 25 seconds.

Between each spraying step, the sample was rinsed with ethanol.

Altogether, 20 cycles of the sequence described were carried out. The resultant sample was dried and analyzed by means of XRD.

Altogether, a 20-layer coating was obtained.

In this example, a different spatial orientation of the crystal lattice produced was achieved by modifying the SAM used as a basis.

What is claimed is:

1. A method of producing a surface coating, wherein the method comprises:
   (a) sequentially applying precursor substances for the coating to a surface of a carrier material by spraying devices while supplying carrier gas from a storage container to provide a coated surface,
   (b) removing unbound molecules from the coated surface of (a) by at least one rinsing device,
   (c) sequentially applying further precursor substances for the coating to a rinsed surface of (b),
   (d) removing unbound molecules from the coated surface of (c) by the at least one rinsing device, and
   (e) repeating (c) and (d) until a desired thickness of the surface coating is achieved;

and wherein substances which afford a surface coating that is crystalline and has a structure of a metal-organic framework and/or a porosity of between 8 and 50 Å are employed as precursor substances.

2. The method of claim 1, wherein at least two different precursor substances are employed.

3. The method of claim 2, wherein one of the precursor substances comprises an organic component and another one of the precursor substances comprises metal ions.

4. The method of claim 3, wherein the organic component comprises a carboxylate compound.

5. The method of claim 3, wherein the organic component comprises a pyridine compound.

6. The method of claim 3, wherein the organic component comprises at least one of 1,3,5-benzenetricarboxylic acid, 1,4-benzenedicarboxylic acid, and naphthalenedicarboxylic acid.

7. The method of claim 3, wherein the metal ions comprise at least one of Cu(II), Zn(II), and Fe(III).

8. The method of claim 3, wherein metal ions are present as acetates.

9. The method of claim 1, wherein the precursor substances are present in dissolved form.

10. The method of claim 9, where the precursor substances are dissolved in one or more of ethanol, water, and DMF.

11. The method of claim 9, wherein the precursor substances are applied as liquid drops which are finely distributed in the carrier gas.

12. The method of claim 11, wherein the carrier gas is an inert gas.

13. The method of claim 12, wherein the carrier gas comprises one or more of nitrogen, argon, and helium.

14. The method of claim 1, wherein one or more of ethanol, water, and DMF are used as rinsing agents.

15. The method of claim 1, wherein the coating has a structure of a metal-organic framework.

16. The method of claim 1, wherein the coating has a porosity of between 8 and 50 Å.

17. A method of producing a surface coating, wherein the method comprises:
   (a) sequentially applying at least two different precursor substances of the coating, at least one of which comprises an organic component selected from carboxylates and pyridine compounds and at least one of which comprises metal ions selected from one or more of Cu(II), Zn(II), and Fe(III) to a surface of a carrier material by spraying devices while supplying inert carrier gas from a storage container to provide a coated surface,
   (b) removing unbound molecules from the coated surface of (a) by at least one rinsing device and using at least one of ethanol, water and DMF as rinsing agent,
   (c) sequentially applying further precursor substances used in (a) to a rinsed surface of (b),
   (d) removing unbound molecules from the coated surface of (c) by at least one rinsing device and using at least one of ethanol, water and DMF as rinsing agent, and
   (e) repeating (c) and (d) until a desired thickness of the surface coating is achieved;

and wherein substances which afford a surface coating that is crystalline and has a structure of a metal-organic framework and a porosity of between 8 and 50 Å are employed as precursor substances.

18. The method of claim 17, wherein metal ions are present as acetates.

\* \* \* \* \*